United States Patent
Dalton et al.

(10) Patent No.: US 7,973,348 B1
(45) Date of Patent: Jul. 5, 2011

(54) SINGLE TRANSISTOR CHARGE TRANSFER RANDOM ACCESS MEMORY

(76) Inventors: David I. Dalton, Colorado Springs, CO (US); Alfred P. Gnadinger, Colorado Springs, CO (US)

( * ) Notice: Subject to any disclaimer, the term of this patent is extended or adjusted under 35 U.S.C. 154(b) by 789 days.

(21) Appl. No.: 11/196,906

(22) Filed: Aug. 4, 2005

Related U.S. Application Data

(60) Provisional application No. 60/599,712, filed on Aug. 6, 2004.

(51) Int. Cl.
H01L 29/76 (2006.01)

(52) U.S. Cl. .................................................. 257/295

(58) Field of Classification Search ............. 257/295, 257/E43.001–E43.007, E27.005–E27.006, 257/E27.008, E29.164, E29.167, E29.272, 257/E29.323, E21.436, E21.663–E21.665, 257/E27.104, 68–71, 296–309, 905–908, 257/E27.084–E27.097, E27.075, E21.646–E21.66, 257/225–234, 390, E27.076, E21.662, E21.666–E21.678; 438/275–278, 3, 785, E21.208; 365/158, 365/171, 173, 55

See application file for complete search history.

(56) References Cited

U.S. PATENT DOCUMENTS

| | | | | |
|---|---|---|---|---|
| 6,790,679 B2 * | 9/2004 | Dimmler et al. | .................. | 438/3 |
| 6,825,517 B2 * | 11/2004 | Dimmler et al. | .............. | 257/295 |
| 6,908,772 B2 * | 6/2005 | Gnadinger | .................. | 438/3 |
| 2002/0070396 A1 * | 6/2002 | Nakajima | .................. | 257/295 |
| 2002/0153542 A1 * | 10/2002 | Gnadinger | .................. | 257/295 |
| 2002/0164850 A1 * | 11/2002 | Gnadinger | .................. | 438/211 |
| 2003/0027360 A1 * | 2/2003 | Hsu et al. | .................. | 438/3 |
| 2004/0026725 A1 * | 2/2004 | Gnadinger | .................. | 257/295 |
| 2004/0041180 A1 * | 3/2004 | Dimmler et al. | .............. | 257/295 |
| 2004/0041186 A1 * | 3/2004 | Dimmler et al. | .............. | 257/296 |
| 2004/0211998 A1 * | 10/2004 | Araujo et al. | .................. | 257/295 |
| 2006/0017120 A1 * | 1/2006 | Sakai | .................. | 257/410 |

FOREIGN PATENT DOCUMENTS

WO    WO2004036651    *    4/2004

* cited by examiner

*Primary Examiner* — Dao H Nguyen
*Assistant Examiner* — Tram H Nguyen

(57) ABSTRACT

A nonvolatile semiconductor memory device is described where each memory cell is composed of a single field effect transistor with a dual gate dielectric comprising a dielectric interfacial layer in contact with a silicon substrate and a ferroelectric layer in between the interfacial layer and the gate electrode. To program (write) the cell the ferroelectric layer is polarized in one of two directions, the ferroelectric polarization creating a large electric field in the interfacial layer. This electric field causes electrons or holes to be transported across the interfacial layer and be trapped in the ferroelectric layer establishing a high (erased) or low (programmed) threshold voltage depending on the direction of the ferroelectric polarization representing the two logic states. To read the memory cell a voltage is applied to the drain of the selected transistor and depending on whether a high or low threshold state was programmed into the cell a low or high current is sensed.

3 Claims, 9 Drawing Sheets a)

b)

Figure 6a
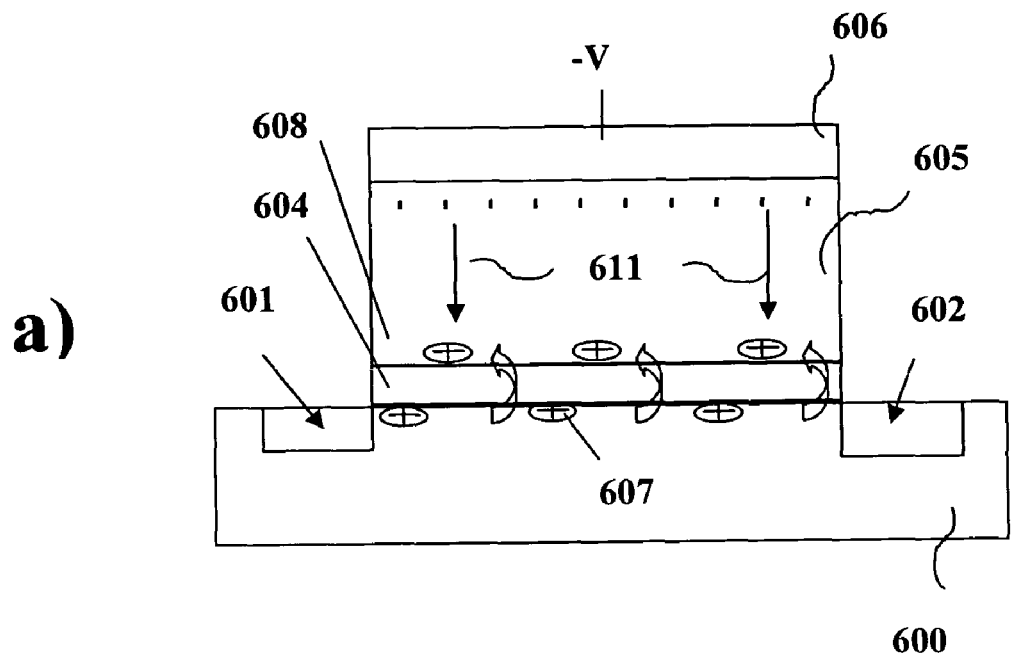
a)
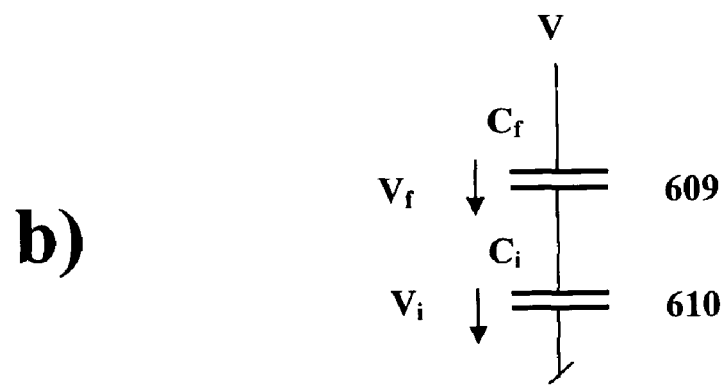
b)

Figure 6b
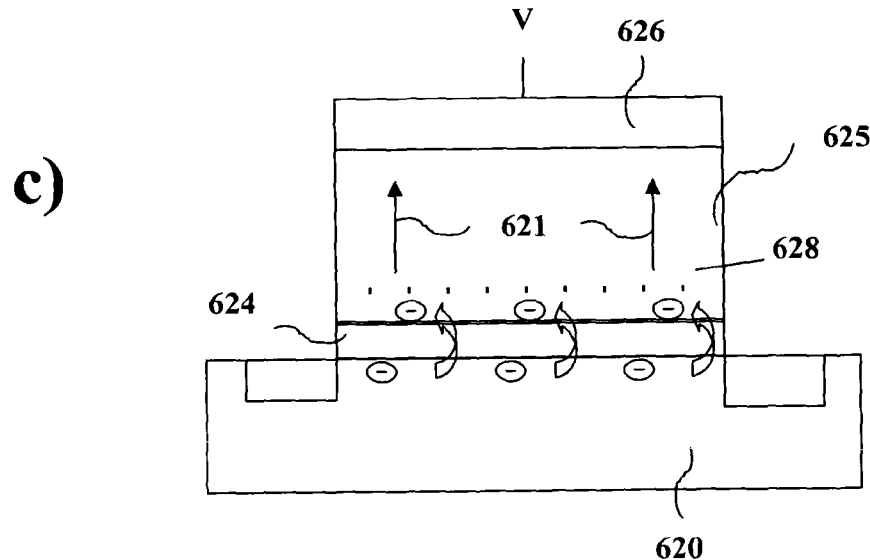
c)
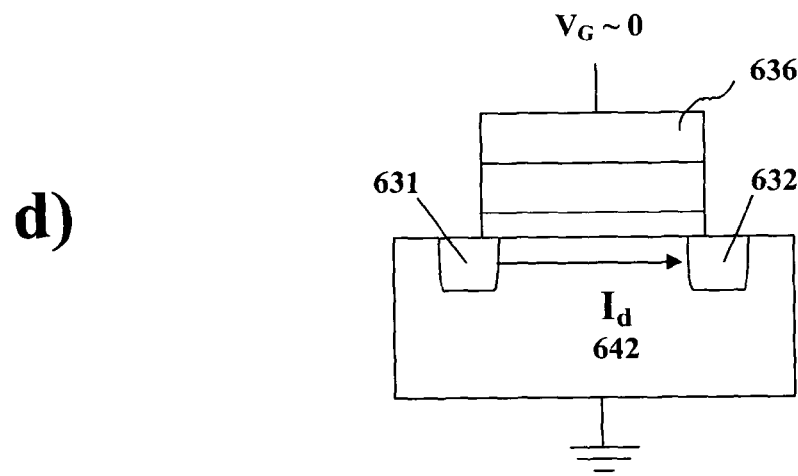
d)
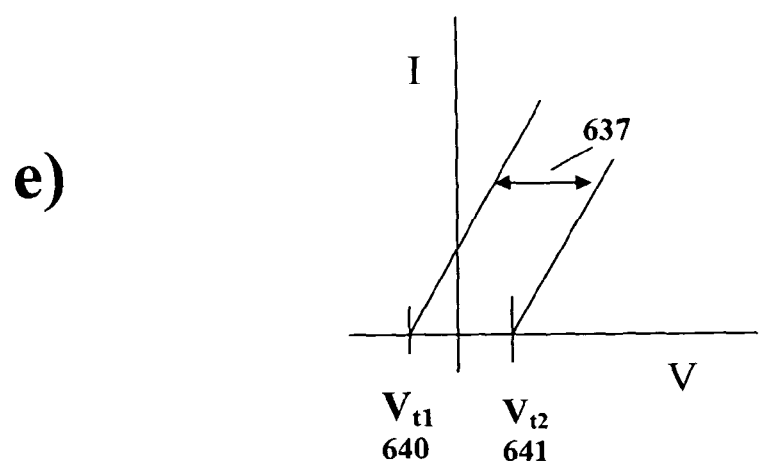
e)

SINGLE TRANSISTOR CHARGE TRANSFER RANDOM ACCESS MEMORY

RELATED APPLICATION

The present application is related to and claims priority from U.S. Provisional Application Ser. No. 60/599,712, filed Aug. 6, 2004, entitled "FERROELECTRIC TUNNEL RANDOM ACCESS MEMORY". The disclosure of the provisional application is herein specifically incorporated in its entirety by this reference.

STATEMENT REGARDING FEDERALLY SPONSORED RESEARCH OR DEVELOPMENT

This invention was made with Government support under contract DASG60-01-C-0046 awarded by the U.S. Army Space and Missile Defense Command. The Government has certain rights to this invention.

FIELD OF THE INVENTION

The invention disclosed relates to the field of nonvolatile semiconductor memory devices and more particularly to memory devices using a single transistor in the memory cell with a dual layer gate dielectric composed of a dielectric interfacial layer and a ferroelectric layer.

BACKGROUND OF THE INVENTION

Nonvolatile semiconductor memory devices represent a multibillion-dollar market. The nonvolatile semiconductor memory technology best known in the prior art operates by injecting holes or electrons into a thin film serving as the gate dielectric of a field effect transistor, thereby shifting the turn-on threshold voltage negatively or positively. Such memories include flash and nonvolatile memories based on silicon nitride thin films. Electrons or holes are injected into a thin film by applying a voltage significantly larger than the read operating voltage. Such memories are known to exhibit excellent retention characteristics, but have marginal endurance properties, slow write times, and high power consumption during write cycles. What is desired, therefore, is a nonvolatile semiconductor memory device that exhibits the desirable characteristics of a flash memory such as small cell size and excellent data retention, but without the undesirable properties of low endurance, slow write times, and high power consumption.

SUMMARY OF THE INVENTION

Disclosed herein is a memory device, a memory cell and method for producing the same which preserves the advantages of a flash device (prior art) such as nonvolatility, small cell size and long data retention, but avoids the shortcomings such as low endurance, slow write times, high programming voltages and high power consumption during the write operation.

The present invention overcomes the limitations of the prior art and provides additional benefits. A brief summary of some embodiments and aspects of the invention are first presented. Some simplifications and omissions may be made in the following summary; the summary is intended to highlight and introduce some aspects of the disclosed embodiments, but not to limit the scope of the invention. Thereafter, a detailed description of illustrated embodiments is presented, which will permit one skilled in the relevant art to make and use aspects of the invention. One skilled in the relevant art can obtain a full appreciation of aspects of the invention from the subsequent detailed description, read together with the Figures, and from the claims (which follow the detailed description).

In one embodiment of the present invention the memory cell is composed of a single field effect transistor enabling a small cell size. This transistor can be formed, for example, utilizing a dual layer dielectric layer composed of a dielectric interfacial layer in contact with the silicon substrate and a ferroelectric layer in between the interfacial layer and the gate electrode.

Under another aspect of the present invention, the interfacial layer material is composed at least partially of hafnium oxide ($HfO_x$). The interfacial layer preferably has dielectric permittivities in the range of 10-30 to allow most of the applied voltage to drop over the ferroelectric layer during a program or erase operation. The band structure of the interfacial layer material preferably has an offset to the silicon bandgap of about 1.5 eV to allow for easy tunneling, when, for example, tunneling is the preferred charge transport mechanism. However, materials other than $HfO_x$ may be used for the interfacial layer, for example $SiO_2$, $Si_3N_4$, transition metal oxides, rare-earth oxides, group I or II oxides or oxides of aluminum (Al). The thickness of the interfacial layer depends on the ferroelectric material and the dielectric permittivities of both layers, since these will affect the operating voltage. In a preferred embodiment it will be in the range of 8-12 nanometers.

The ferroelectric layer may be formed by any known deposition technique such as metal-organic chemical vapor deposition (MOCVD), atomic layer deposition (ALD), physical vapor deposition (PVD), chemical solution deposition (CSD) and others. Ferroelectric layer thickness is in the range of 10-200 nanometers and is scalable with future scaling requirements for the transistors. Any commonly used ferroelectric material can be used provided their parameters fall in an acceptable range for device performance. The dielectric permittivity is preferably low enough (with respect to the dielectric permittivity of the interface layer) to allow most of the voltage applied between the gate electrode and the substrate to drop over the ferroelectric layer during a program or erase operation. Values of 20-100 are desirable although higher dielectric permittivities are also acceptable. The remnant polarization of the ferroelectric material after a program or erase operation determines to a large degree the value of the electric field established in the interfacial layer since that field value is proportional to the remnant polarization of the ferroelectric layer. Values of 1-10 $\mu C/cm^2$ are desirable, although values outside of this range are also acceptable. Potential ferroelectric materials are lead-zirconate-titanate (PZT), strontium bismuth tantalate (SBT), bismuth lanthanum titanate (BLT), and rare earth manganites, for example yttrium manganite ($YMnO_3$).

The gate electrode material is either a noble metal, a conductive oxide such as iridium oxide, rhodium oxide or ruthenium oxide, or a metal such as Al or TiN. Any commercial deposition technique can be used for forming the gate layer, such as sputtering (physical vapor deposition) or MOCVD. The combination of interfacial layer, ferroelectric layer and gate electrode is called gate stack.

The source and drain structures of the memory cell transistor can either be formed prior or after the gate dielectric deposition by any technique generally accepted in the industry such as diffusion or ion implantation. Formation of source and drain prior to gate stack formation has the advantage that high annealing temperatures can be used to activate the junctions. However there will be an alignment tolerance between source/drain and gate stack that reduces transistor performance due to a large overlap capacitance (Miller capacitance). Formation of source and drain after the gate stack formation has the advantage that the Miller capacitance is reduced leading to higher transistor speed and a smaller cell size because source/drain and gate stack are self-aligned. However, the gate stack material choices in such a self-aligned structure may not allow the optimum thermal treatment of the transistor, for example 900 C for 30 min.

To form a memory array according to another aspect of the present invention, a plurality of single transistor memory cells are arranged in rows and columns. In order to operate the memory device, all gates in a row are connected to a single word line, all sources in a column are connected to a bit line and all drains in a column are connected to a complement bit line. Word lines and bit lines are connected to decoders and sense amplifiers as known in the prior art. Depending on design trade-offs, adjacent bit and complement bit lines may be combined into a single bit line. The most common array architecture provides for a single cell to be written and read. However, blocks of cells may be written in a single device operation. In order to prevent non-selected cells to be inadvertently written or read, voltages are applied between bit lines, word lines and substrate in such a way that minor disturb voltages are created over the gate stack of non-selected cells, these disturb voltages being small enough to not polarize the ferroelectric layer.

A detailed description of the device operation is given below.

BRIEF DESCRIPTIONS OF THE DRAWINGS

FIG. 6 is a cross sectional view of one embodiment of a transistor in the single transistor memory cell illustrating the charge injection mechanism showing the erase mechanism, the program (write) mechanism and the read mechanism.

Figure 7:
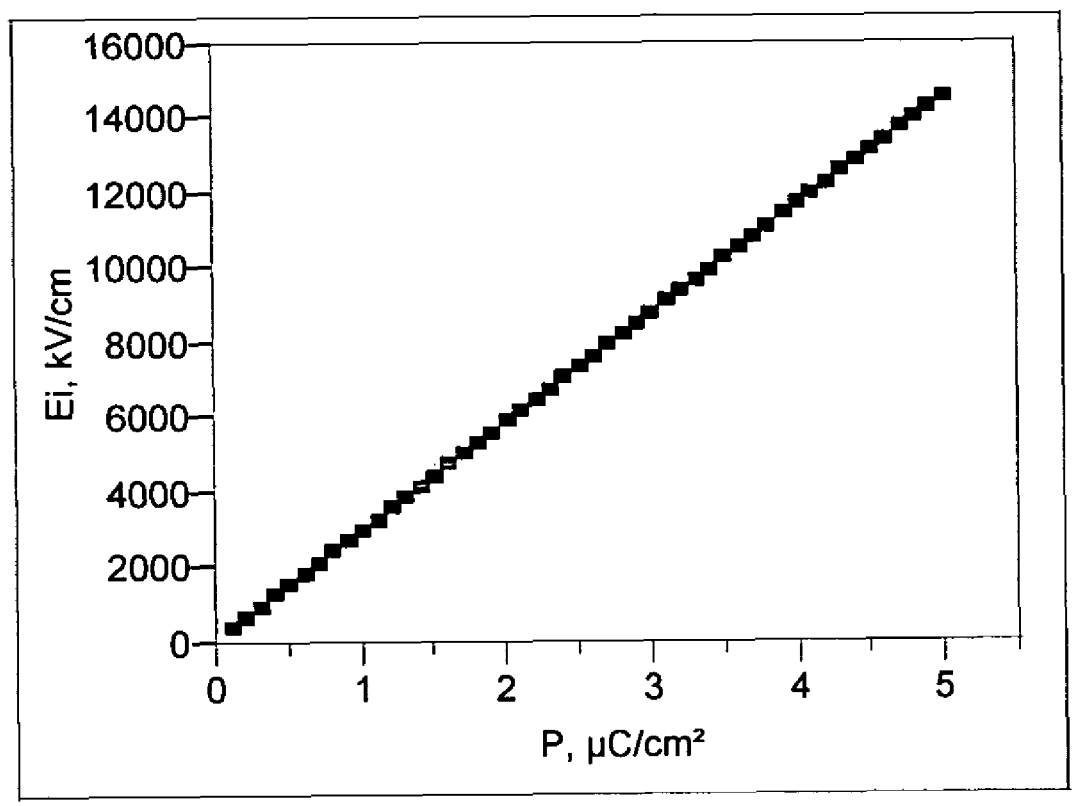
FIG. 7 is a plot of the electric field in the interfacial layer caused by the polarization of the ferroelectric layer according to one embodiment of the present invention.

In the drawings, the same reference numbers identify identical or substantially similar elements or acts. To easily identify the discussion of any particular element or act, the most significant digit or digits in a reference number refer to the Figure number in which that element is first introduced (e.g., element 704 is first introduced and discussed with respect to FIG. 7).

As is conventional in the field of electrical circuit representation, sizes of electrical components are not drawn to scale, and various components can be enlarged or reduced to improve drawing legibility. Component details have been abstracted in the Figures to exclude details such as position of components and certain precise connections between such components when such details are unnecessary to the invention. The headings provided herein are for convenience only and do not necessarily affect the scope or meaning of the claimed invention.

The Figures depict embodiments of the present invention for purposes of illustration only. One skilled in the art will readily recognize from the following discussion that alternative embodiments of the structures and methods illustrated herein may be employed without departing from the principles of the invention described herein

DETAILED DESCRIPTION OF THE INVENTION

Figure 1:
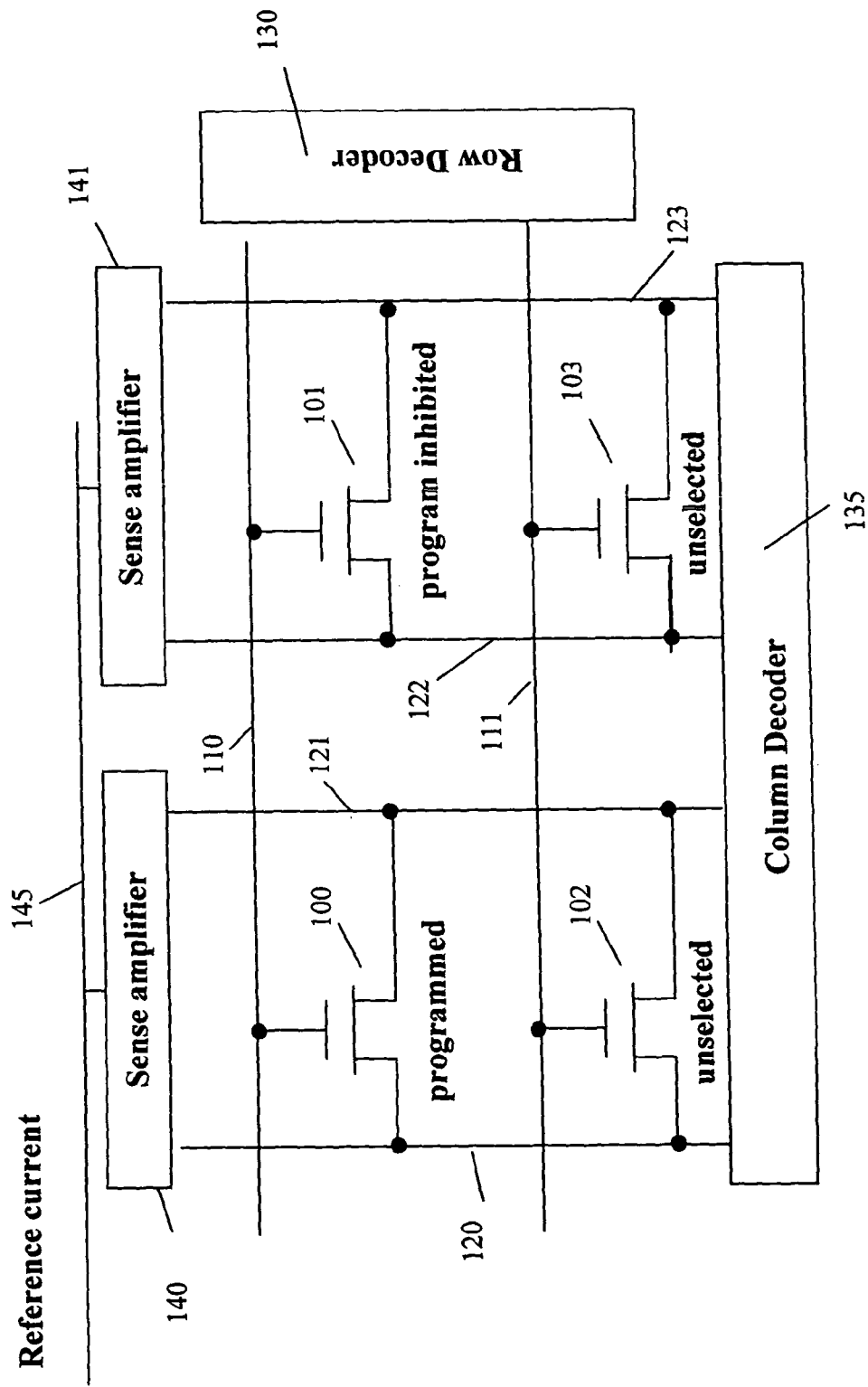
FIG. 1 is a schematic representation of a memory array with single field effect transistors as memory cells according to one embodiment of the present invention.

FIG. 1 is a schematic representation of a 2×2 array of single transistor memory cells arranged in rows and columns according to one embodiment of the present invention. The gate electrodes of the transistors in a common row are connected to and share a common word line. For example, devices 100 and 101 share word line 110, and devices 102 and 103 share word line 111. The sources and drains of the transistors in a common column share a common bit line pair. For example, the sources of transistors 100 and 102 share bit line 120, while drains share a common (complement) bit line 121. The sources of transistors 101 and 103 share bit line 122, while drains share a common (complement) bit line 123. In another embodiment of the invention bit line 121 and complement bit line 122 are combined and form a common bit line. A given word line is selected by a row decoder 130. One or more bit line pairs are selected by column decoder 135. A sense amplifier is connected to each bit line pair (for example, sense amplifier 140 to bit line 120 and bit line 121, sense amplifier 141 to bit line 122 and bit line 123), and compares the respective bit line current to a reference current 145. The reference current provides a current of magnitude between the magnitude of currents produced on the respective bit line when reading the high state and the low state on the selected transistor (see below), thereby causing the sense amplifier to flip in one direction or the other depending on the state stored in the selected single transistor memory cell.

The following explains the operation of the nonvolatile memory built with single transistor memory cells according to one embodiment of the present invention.

In the embodiment represented in FIG. 1 assume that transistor 100 is the transistor to be programmed, 101 is program inhibited and transistors 102 and 103 are unselected.

To initially erase transistor 100, a negative voltage of, for example, −3V is applied to word line 110 with all other terminals grounded (0V applied). This applies a negative gate voltage to transistor 100 setting him into a high (or erased) threshold voltage state. All transistors connected to word line 110 will also be erased, for example transistor 101. To initially erase all cells, the row decoder 130 will cycle through all row addresses. For example, cells 102 and 103 will be erased by selecting word line 111 and applying −3V to word line 111 with all other terminals grounded (0V applied).

To program cell 100 a positive voltage, for example +3V is applied to word line 110 and 0V to all other word lines, for example word line 111. To prevent transistor 101 of being programmed, a positive voltage, for example +3V is applied to the bit lines 122 and 123, which prevents any voltage drops across the terminals of transistor 101. Since all transistors in the column where transistor 101 is located are connected to bit lines 122 and 123, a negative voltage appears between the gates of those unselected transistors and their sources and drains. However, since these transistors are OFF, no channel is formed and no voltage is applied between gate and channel preventing the states of these transistors of being altered. A fringe disturb field, however, is present at the edge of the transistor gates. However, these disturb fields are not sufficient to change the transistor state.

To read the selected cell 100 a small, positive voltage, for example +0.5 V is applied to bit line 121 with all other terminals grounded (0V applied). Depending on whether the high and low threshold voltage states are centered around zero gate voltage (see FIG. 6e), word line 110 will be grounded (0V applied). Otherwise a voltage half way across the memory window (see FIG. 6e) will be applied to word line 110. A current flows between source and drain of transistor 100 under the influence of the drain voltage applied to bit line 121. Sense amplifier 140 compares this current to a reference current 145. When the transistor is in a high threshold voltage state, this current is small, representing, for example, a logic state "0". When the transistor is in a low threshold voltage state, this current is larger, representing, for example, a logic state "1".

The operation of the individual memory cells composed of single transistors according to the present invention is now explained.

Figure 2:
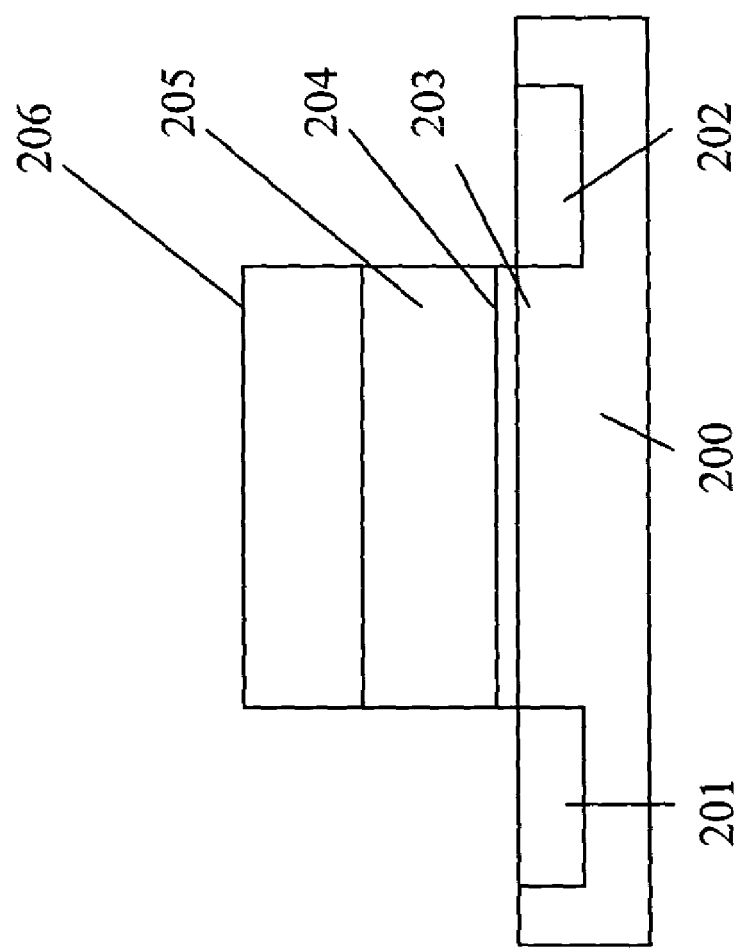
FIG. 2 is a cross sectional diagram of a single transistor memory cell according to one embodiment of the present invention.

FIG. 2 is a cross sectional view illustrating the structure of the dual layer gate dielectric field effect transistor according to one embodiment of the present invention. In a first embodiment of the present invention, n-type silicon regions 201 and 202 are formed within p-type silicon substrate 200, resulting in an n-channel transistor, the region between them disposing the channel region 203. A dielectric interfacial layer 204 is formed on the channel region 203. Ferroelectric layer 205 is formed on dielectric interfacial layer 204 and gate electrode layer 206 is formed on top of ferroelectric layer 205.

In another embodiment of the present invention, regions 201 and 202 are p-type silicon formed within n-type silicon substrate resulting in a p-channel transistor. In yet another embodiment of the present invention silicon substrate 200 is formed as a thin film on top of an insulating substrate such as $SiO_2$ or sapphire.

Interfacial dielectric layer 204 is preferably composed of an insulating dielectric thin film such as a thin film of silicon dioxide ($SiO_2$) or silicon nitride ($Si_3N_4$), transition metal oxide, rare-earth oxide, Group I or II oxide or oxide of aluminum (Al). In yet another embodiment of the present invention, the interfacial layer is at least partially composed of hafnium oxide ($HfO_x$). The interfacial layer is formed utilizing any one of a variety of methods including oxidation, physical vapor deposition (PVD) (sputtering), atomic layer deposition (ALD), metal-organic chemical vapor deposition (MOCVD) or chemical solution deposition (CSD) such as sol-gel deposition or MOD.

In one embodiment of the present invention the source and drain regions 201 and 202 are formed prior to the formation of the interfacial layer 204, the ferroelectric layer 205 and the gate electrode 206. This is advantageous since high temperatures (e.g. 900° C.) can be employed to activate the source and drain junctions. This high temperature would be detrimental to the gate stack.

In another embodiment of the present invention, the source and drain regions 201 and 202 are formed after the formation of the interfacial layer 204, the ferroelectric layer 205 and the gate electrode 206. This allows a self aligned structure to be formed where there is a lack of or minimal overlap of the gate stack over the source and drain regions 201 and 202 resulting in a faster transistor performance because of the smaller overlap capacitance (Miller capacitance) between gate electrode 206 and source and drain regions 201 and 202.

The ferroelectric material is comprised of any material exhibiting ferroelectric hysteresis, preferably one with a relatively low dielectric permittivity $\in_r$ (for example $\in_r$<100) so that a relatively large component of a voltage applied across the structure consisting of ferroelectric layer 205 and dielectric interfacial layer 204 falls across the ferroelectric layer 205. It is desirable that the remnant polarization $P_r$ falls into an acceptable range so that is creates a sufficiently large electric field across the interfacial layer 204 to stimulate charge carrier transport from substrate 200 across the interfacial layer 204. Acceptable values are from about 5 $\mu C/cm^2$ to about 30 $\mu C/cm^2$. However, $P_r$ values outside of this range may also be acceptable. Ferroelectric materials that are suitable are, for example, lead zirconate titanate (PZT), strontium bismuth tantalate, bismuth lanthanum titanate, and rare earth manganites, for example yttrium manganite ($YMnO_3$). However, many other materials exhibiting ferroelectric hysteresis are also applicable.

The ferroelectric layer is formed utilizing any one of a variety of methods including physical vapor deposition (PVD) (sputtering), atomic layer deposition (ALD), metal-organic chemical vapor deposition (MOCVD) or chemical solution deposition (CSD) such as sol-gel deposition or MOD.

The terminals of the nonvolatile semiconductor memory cell transistor of FIG. 2 are source 201, drain 202, gate electrode 206 and substrate (body) 200.

Figure 3:
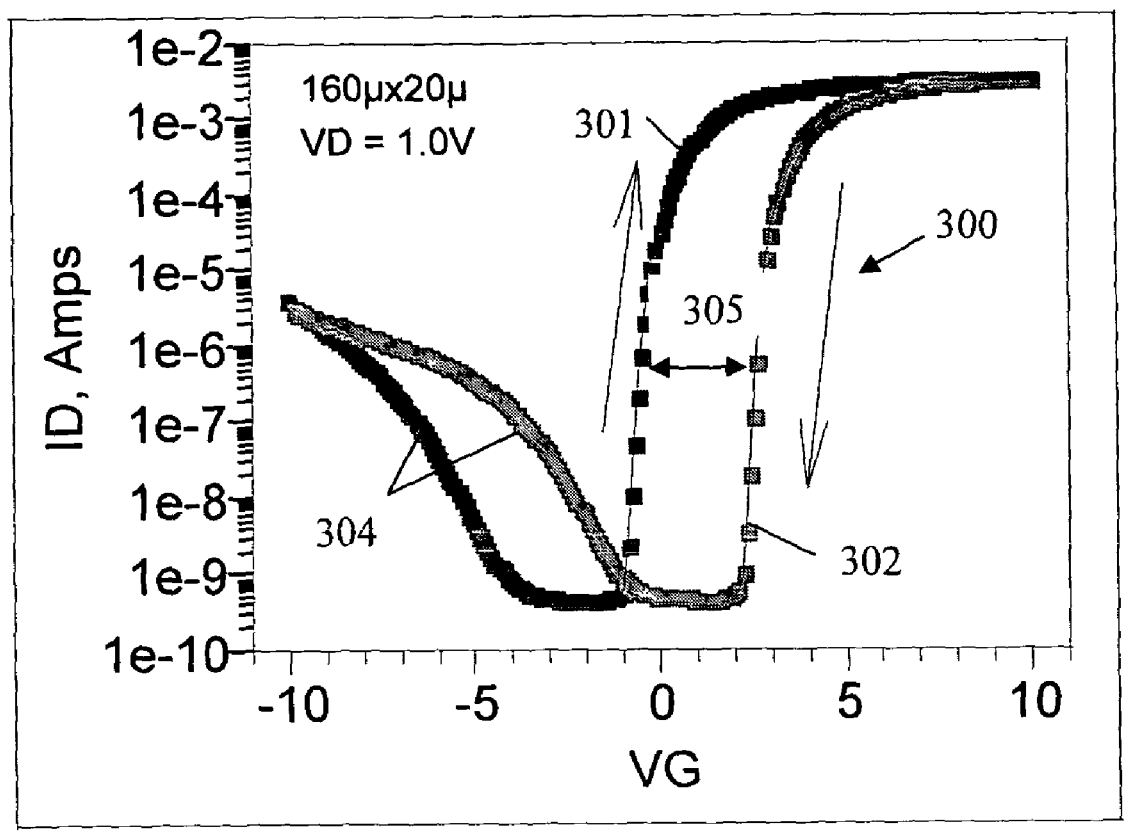
FIG. 3 is a plot of drain current versus gate voltage of a transistor in the single transistor memory cell, illustrating the hysteresis effect achieved by the charges injected and trapped in the gate dielectric under the influence of the electric field caused by the ferroelectric polarization.

When a varying gate voltage $V_G$ (for example starting at −10V, increasing gradually to +10V and returning to −10V) is now applied between gate electrode 206 and body 200 in FIG. 2 and a small drain voltage is applied between drain 202 and source 201, a drain current hysteresis 300 is obtained consisting of a left trace 301 and a right trace 302 as shown in FIG. 3. The direction of the hysteresis loop is clockwise (for an n-channel device in this embodiment), that means when the gate voltage $V_G$ starts at the negative extreme (−10 V in this example) and sweeps to the positive extreme (+10 V in this example) the left trace 301 is generated whereas the right trace 202 is generated when the gate voltage returns to the negative extreme. The hysteresis loop would be a mirror image across the $V_G$=0 axis and the direction would be counter-clockwise for a p-channel device. The current increase 304 from 0 to −10V in FIG. 3 is an artifact caused by the specific device formation (large Miller capacitance) and is not relevant to the present invention. The horizontal separation of the $I_d$ versus $V_G$ curves, that means the horizontal separation of traces 301 and 302, is the memory window 305. In the embodiment in FIG. 3 the memory window 305 has a value of about 3 V. The direction of the hysteresis loop is clockwise for an n-channel transistor. This is significant, since it is opposite to the one for a ferroelectric transistor, pointing to a different device operation as will be explained below.

Figure 4:
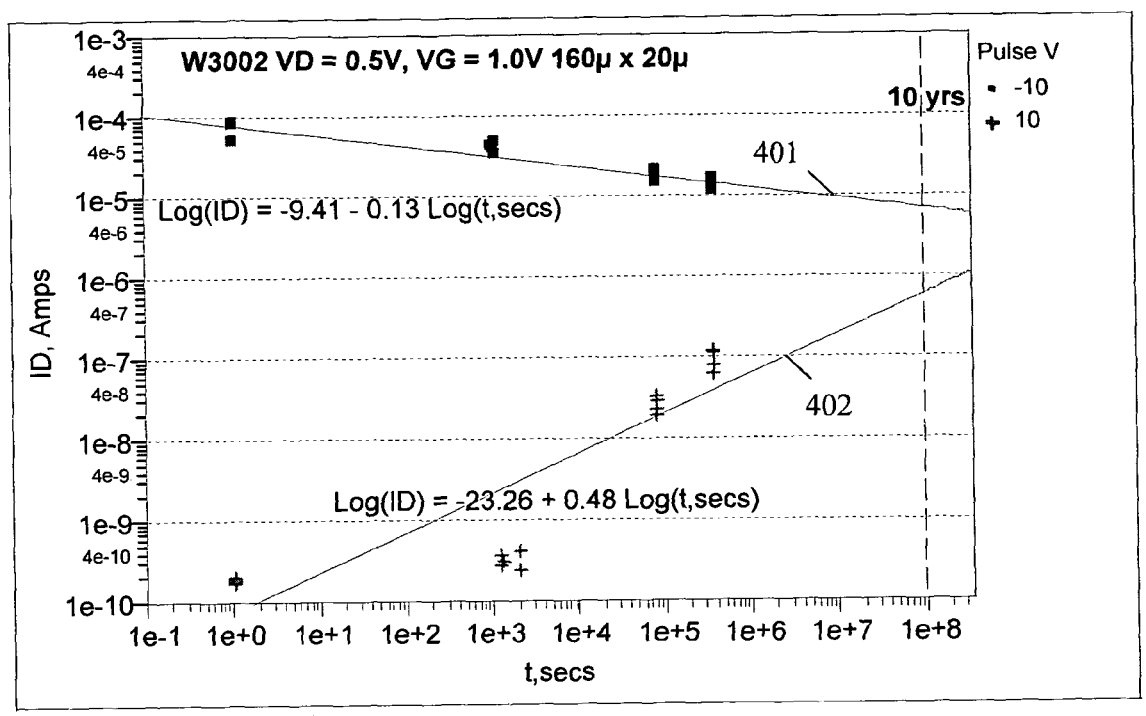
FIG. 4 is a plot of the memory window as a function of time.

Data retention, meaning the time elapsed until the programmed information is lost, is important in any nonvolatile semiconductor memory device. Data retention is preferably greater than several months or years, preferable greater then 10 years, for a technology to be commercially useful. When data was written into a transistor of the current invention and the drain current observed while maintaining zero volts at the gate, the device is biased approximately in the middle of the memory window 305 in FIG. 3. That means that the drain current 301 is relatively large when the transistor was programmed into the low threshold voltage state representing for example the logic state "0" or the drain current 302 is relatively small when the transistor was programmed into the high threshold voltage state representing for example the logic state "1". FIG. 4 shows a plot of drain current versus time with the gate electrode held at ground potential in a device according to the present invention. When the device is programmed into the low threshold voltage state and the drain current is relatively large it will gradually decrease over time as shown in the upper trace 401 of the drain current plot in FIG. 4. When the device is programmed into the high threshold voltage state and the drain current is relatively small it will gradually increase over time as shown in the lower trace 402 of the drain current plot in FIG. 4. The information is lost when the 2 traces cross each other since a logic state "0" or "1" can no longer be distinguished. In the embodiment represented in FIG. 4 this will occur at a time greater than $10^8$ seconds, which means greater than 10 years. This condition is extrapolated from data taken up to $10^6$ seconds.

Figure 5:
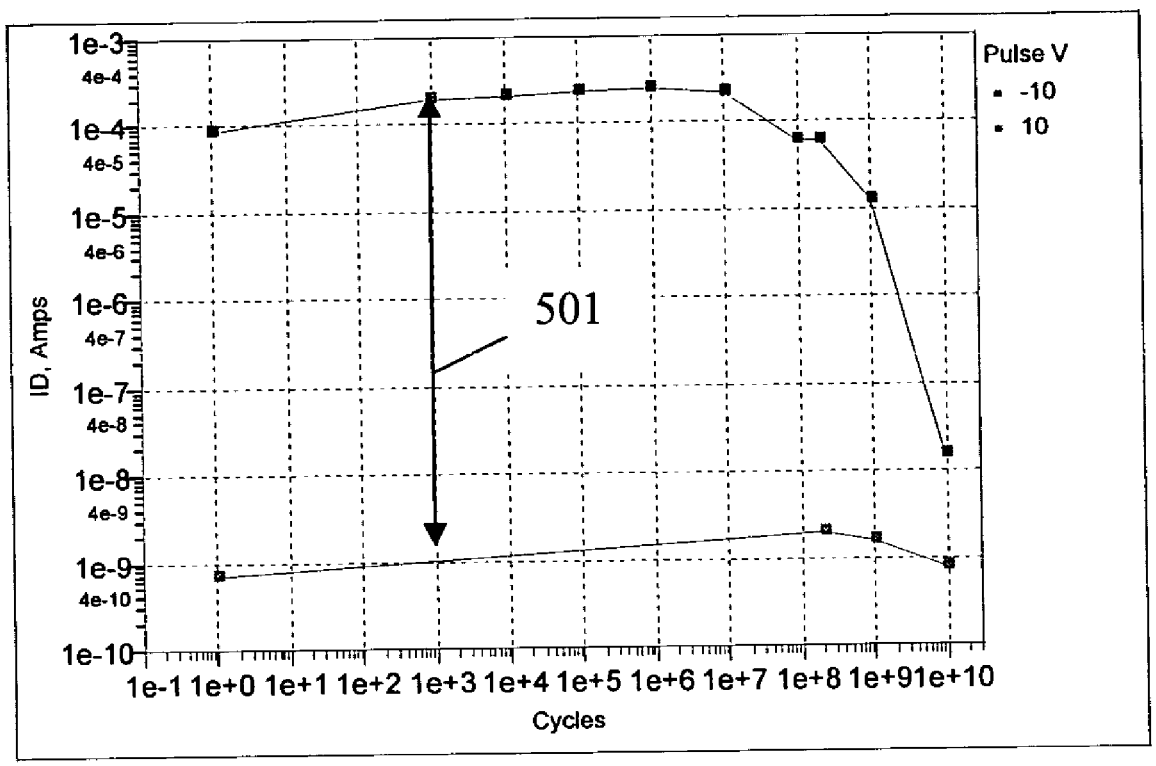
FIG. 5 is a plot of the memory window as a function of the number of endurance cycles.

Endurance of the memory device under cycling is an important reliability consideration. Nonvolatile memory devices (e.g. flash) can typically survive $10^5$ cycles. FIG. 5 shows an endurance plot (memory window 501 as a function of the number of applied cycles). The memory window of the transistor of the present invention decreases with increasing number of cycles but is still large enough for device operation (>1V) after $10^9$ cycles.

The following model of operation of a single memory cell, according to one embodiment of the present invention, is consistent with the data presented in FIG. 3-5.

FIG. 6a is a schematic illustration of the erase operation of a single transistor memory cell according to one embodiment of the present invention. This operation is applied to all memory cells in an array prior to programming in order to establish a well-defined starting point. A negative voltage $-V$ is applied between gate electrode 606 and substrate 600. Alternatively, when many cells are formed in a common substrate, a positive voltage +V is applied instead to source 601, drain 602 and substrate 600 with respect to the gate electrode 606 which is held at ground potential (V=0). This prevents any junctions of becoming forward biased and is equivalent to a negative voltage applied to gate 606. As shown in the electrical diagram FIG. 6b, the voltage V is divided between the equivalent ferroelectric layer capacitance 609 and the equivalent interfacial layer capacitance 610 according to the capacitive divider equation $$V_f/V = C_f/C$$

where $C_f$ is the ferroelectric layer capacitance 609 and C is the total capacitance of the gate stack given by $$1/C = 1/C_i + 1/C_f$$

where $C_i$ is the equivalent interfacial layer capacitance 610. The voltage drop $V_i$ over the interfacial layer 604 is given by $$V_i = V - V_f$$

Depending on the values of the respective interfacial layer and ferroelectric layer capacitances, a certain portion, for example 80%, of the applied voltage drops over the ferroelectric layer 605. When the voltage $V_f$ is larger than the coercive voltage of the ferroelectric layer 605, it switches the polarization P of the ferroelectric layer 611 in the direction pointing from gate electrode 606 toward substrate 600. This establishes a large electric field in the interfacial layer 604, a field which remains even when the erase voltage V is returned to zero as long as the ferroelectric layer 605 remains polarized.

The value of the electric field in interfacial layer 604, $E_i$, is given by $$E_i = P/\epsilon_i \epsilon_0$$

where P is the polarization of the ferroelectric layer 605, $\epsilon_i$ the permittivity of the interfacial layer 604 and $\epsilon_0$ the permittivity of free space. A plot of the electric field in the interfacial layer 604 due to the polarization of the ferroelectric layer 605 is given in FIG. 7. For example, a polarization P=5 µC/cm² gives rise to an electric field of 14 MV/cm, which is large enough to cause tunneling of holes (positively charged carriers) 607 (see FIG. 6a) from the channel region 603 across the interfacial layer 605 into the ferroelectric layer 605 where they are trapped in the vicinity of the interfacial layer/ferroelectric layer interface 608. These trapped positive charges cause a negative threshold voltage shift, setting the threshold voltage of the cell transistor into a first (more negative or erased) state 640 as shown in FIG. 6e.

Figure 8:
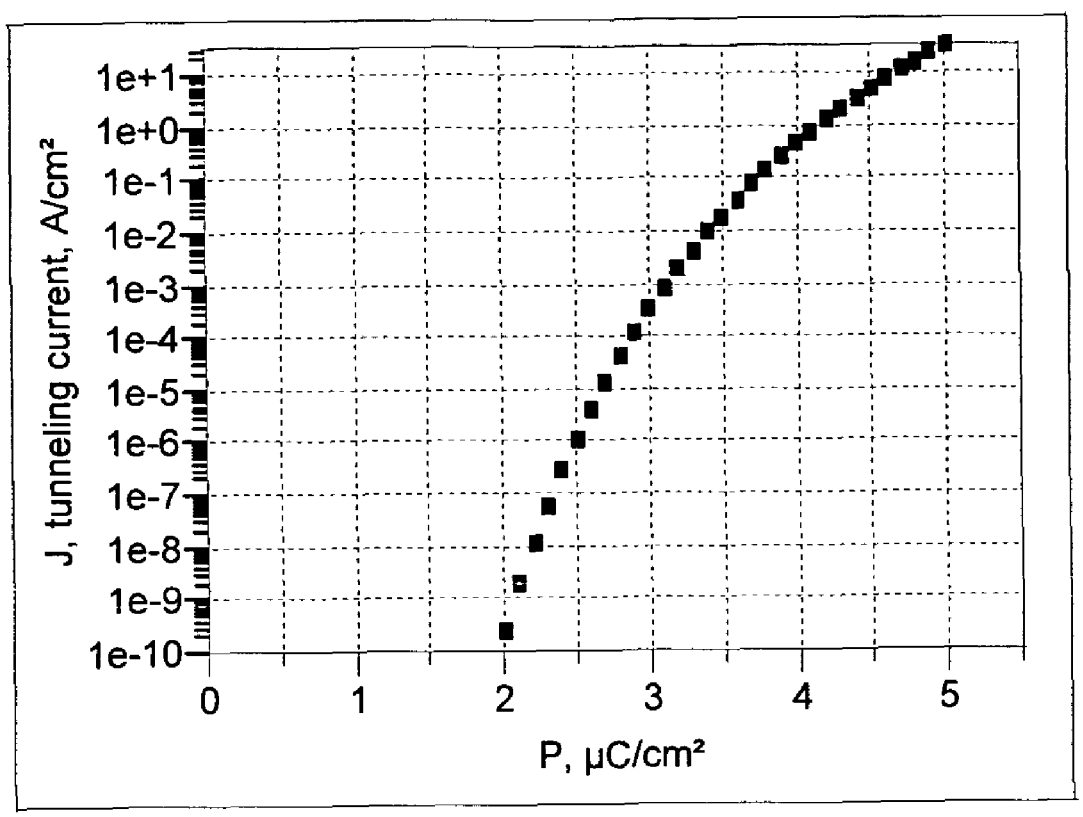
FIG. 8 is a plot of Fowler-Nordheim (FN) tunneling current through a $SiO_2$ interfacial layer as a function of the polarization of the ferroelectric layer according to one embodiment of the present invention.

The preferred transport mechanism for the charge carriers 607 depends on the material chosen for interfacial layer 604. In one embodiment of the present invention interfacial layer 604 is formed from hafnium oxide. Hafnium oxide has a conductance band offset of about 1.5 eV with respect to the conduction band of silicon, so that Fowler-Nordheim (FN) tunneling is the likely transport mechanism. FIG. 8 is a plot of the Fowler-Nordheim tunneling current as a function of the ferroelectric polarization P responsible for the electric field in the interfacial layer 604. A value of 5 µC/cm² will create a large current of 10 A/cm² which is consistent with very fast charging of the device. The trapped charge 607 in the vicinity of the interfacial/ferroelectric layer interface 608 as illustrated in FIG. 6a, acts against the ferroelectric polarization, which in turn reduces the electric field in interfacial layer 604. When the value of the electric field falls below a certain threshold needed for FN tunneling, the charging stops. The described erase mechanism is, therefore, self-limiting, preventing over-erasure which is a problem in prior art flash devices. The same argument applies to the write operation described below. This self-limiting charge transport mechanism is responsible for the improved endurance properties compared to prior art devices as shown in FIG. 5.

FIG. 6c is a schematic illustration of the program operation of a single transistor memory cell according to one embodiment of the present invention. This operation is applied to the memory selected in the manner described in FIG. 1. A positive voltage V is applied between gate electrode 626 and substrate 620 with all other terminals grounded (V=0). The voltage V is divided between the equivalent ferroelectric layer capacitance 609 and the equivalent interfacial layer capacitance 610 in an equivalent way as shown for the erase operation (FIG. 6b). The voltage $V_f$ dropped over the ferroelectric layer 624 reverses the direction of the ferroelectric polarization 621, which means the ferroelectric layer 625 is now polarized from substrate 620 toward gate electrode 626. This establishes a large electric field in the interfacial layer 624, in the opposite direction as under the erase operation, a field, which remains even when the programming voltage V is returned to zero as long as the ferroelectric layer 625 remains polarized. This field causes electrons to tunnel from substrate 620 across the interfacial layer 624 into the ferroelectric layer 625 where they are trapped in the vicinity of the interfacial layer/ferroelectric layer interface 628. These trapped negative charges cause a positive threshold voltage shift, setting the threshold voltage of the cell transistor into a second (more positive or programmed) state 641 as shown in FIG. 6e.

FIGS. 6d and 6e are a schematic illustration of the read operation of a single transistor memory cell according to one embodiment of the present invention. This operation is applied to the memory selected in the manner described in FIG. 1. A small voltage is applied to the drain terminal 632 with respect to the source terminal 631 of the transistor. A gate voltage $V_G$ about halfway across the memory window 637 is applied to the gate 636. This voltage is usually close to zero. When the memory window is not centered properly around zero, a threshold adjust implant could be used to properly center the transistor characteristics around zero. Depending on whether a high threshold voltage state 641 or a low threshold voltage state 640 is written into the device, a low or a high drain current $I_d$ (642) is observed during the read operation. This current is compared to a reference current 145 (see FIG. 1) and a logic level "0" or a logic level "1" is registered.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," and words of similar import, when used in this application, shall refer to this application as a whole and not to any particular portions of this application.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform the same function while having steps in a different order. The teachings of the invention provided herein can be applied to other systems, not necessarily the single transistor memory system describe previously. These and other changes can be made to the invention in light of the detailed description. Furthermore, the elements and acts of the various embodiments above can be combined to provide further embodiments beyond those described.

These and other changes can be made to the invention in light of the above detailed description. In general, the terms used in the following claims, should not be construed to limit the invention to the specific embodiments disclosed in the specification, unless the above detailed description explicitly defines such terms. Accordingly, the actual scope of the invention encompasses the disclosed embodiments and all equivalent ways of practicing or implementing the invention under the claims. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

What is claimed is:

1. A nonvolatile semiconductor memory device comprising at least one memory cell field effect transistor (FET) comprising a substrate, a dielectric interfacial layer overlying said substrate, a ferroelectric layer overlying said dielectric interfacial layer, a gate electrode overlying said ferroelectric layer, and a voltage applied between said gate and said substrate, wherein the magnitude of said voltage is such that charge injection from said substrate through said interfacial layer into said ferroelectric layer occurs.

2. The nonvolatile semiconductor memory device of claim 1, wherein transportation of charge carriers from said substrate through said dielectric interfacial layer is caused from a mechanism selected from a group consisting of tunneling, Fowler-Nordheim tunneling, hot carrier injection, avalanche breakdown, and impact ionization.

3. The nonvolatile semiconductor memory device of claim 1, wherein transportation of charge carriers from said substrate through said dielectric interfacial layer is caused by Fowler-Nordheim tunneling.

* * * * *